United States Patent
Kodama (10) Patent No.: US 7,440,305 B2
(45) Date of Patent: Oct. 21, 2008

(54) SEMICONDUCTOR STORAGE DEVICE WITH BIT LINE STRUCTURE DISCONNECTED IN THE MIDDLE OF THE ARRAY FOR REDUCING POWER CONSUMPTION

(75) Inventor: Tsuyoshi Kodama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 272 days.

(21) Appl. No.: 11/312,587

(22) Filed: Dec. 21, 2005

(65) Prior Publication Data

US 2007/0070678 A1    Mar. 29, 2007

(30) Foreign Application Priority Data

Sep. 28, 2005    (JP)    ............................. 2005-282416

(51) Int. Cl.
*G11C 5/06*    (2006.01)
(52) U.S. Cl. ....................................................... 365/63
(58) Field of Classification Search .................. 365/63, 365/94, 227
See application file for complete search history.

(56) References Cited

U.S. PATENT DOCUMENTS

| 5,835,396 | A  | * | 11/1998 | Zhang ......................... 365/51 |
| 6,538,270 | B1 | * | 3/2003  | Randolph et al. ............ 257/208 |
| 6,917,544 | B2 | * | 7/2005  | Maayan et al. ......... 365/185.33 |

FOREIGN PATENT DOCUMENTS

| JP | 9-162308 A    | 6/1997 |
| JP | 2002-150790 A | 5/2002 |

* cited by examiner

*Primary Examiner*—VanThu Nguyen
(74) *Attorney, Agent, or Firm*—Arent Fox LLP.

(57) ABSTRACT

A semiconductor storage device comprising a plurality of memory cells disposed in an array in the row and column directions and a bit line extending in the column direction of the memory cell or a word line extending in its row direction, which is disconnected in the middle of the array.

18 Claims, 14 Drawing Sheets

SEMICONDUCTOR STORAGE DEVICE WITH BIT LINE STRUCTURE DISCONNECTED IN THE MIDDLE OF THE ARRAY FOR REDUCING POWER CONSUMPTION

CROSS-REFERENCE TO RELATED APPLICATIONS

This application is based upon and claims the benefit of priority from the prior Japanese Patent Application No. 2005-282416 filed on Sep. 28, 2005, the entire contents of which are incorporated herein by reference.

BACKGROUND OF THE INVENTION

1. Field of the Invention

The present invention relates to a reduction method of power consumption in a semiconductor storage device, and more particularly relates the low power consumption method of a semiconductor storage memory to reduce the load capacity of a bit line to reduce power consumption, by cutting off the bit line on the boundary, for example, between a data or program storage area and a standby storage area, for example, in read-only memory.

2. Description of the Related Art

Figure 1:
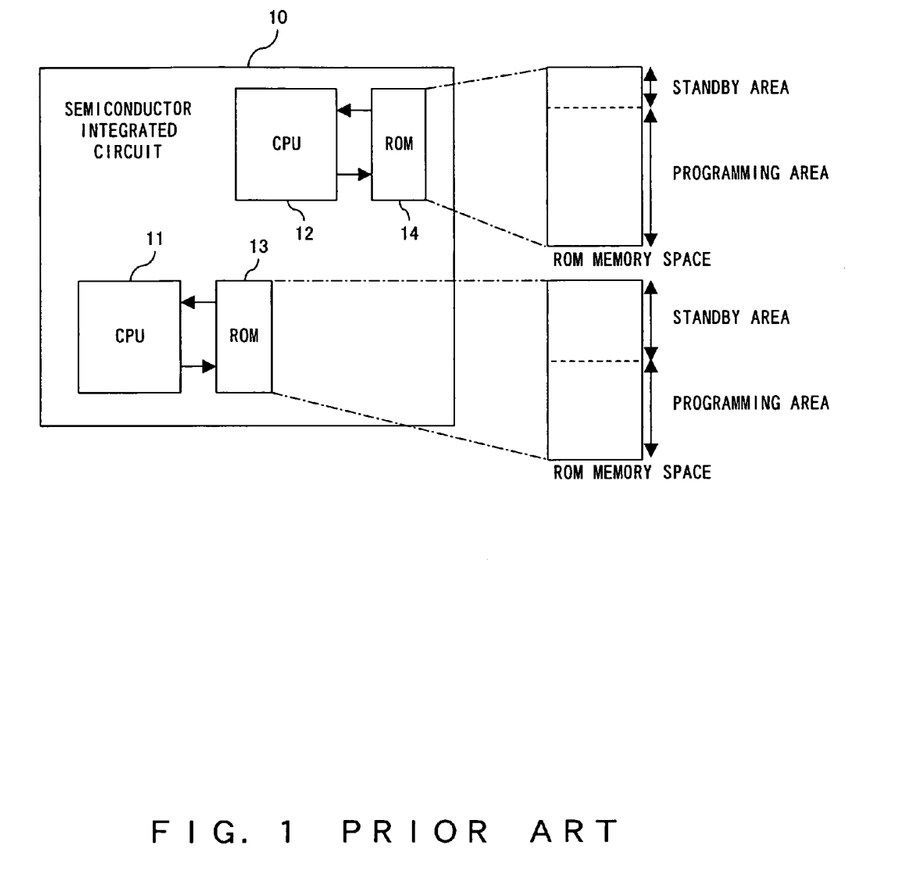
FIG. 1 shows a conventional semiconductor integrated circuit.

Generally, a plurality of pieces of read-only memory (ROM) is mounted on a semiconductor integrated circuit. FIG. 1 shows such a conventional semiconductor integrated circuit. In FIG. 1, two central processing units (CPU) 11 and 12 are mounted on a semiconductor integrated circuit 10. For example, dedicated ROM 13 and 14 are mounted on the CPU 11 and 12, respectively. For example, programming data is stored in such ROM as data. If it is scheduled that such data is updated in or added to such a semiconductor integrated circuit in a design stage, the number of words of the ROM as a programming area is designed larger than actually used from the beginning, expecting such a data modification.

When a program bug is discovered or the program is rewritten in a new program later, sometimes an area greatly exceeding the initially designed programming area must be needed depending on its modification contents. In that case, in order to greatly increase the number of words of the ROM and re-design the semiconductor integrated circuit accordingly, a mask and a reticle must be newly prepared for all layers, which becomes a big problem in terms of a cost and a turn-around time. In order to avoid such a problem, as shown in FIG. 1, a fairly large standby area compared to the initial programming area is generally prepared as the memory space of the ROM and designed.

Figure 2:
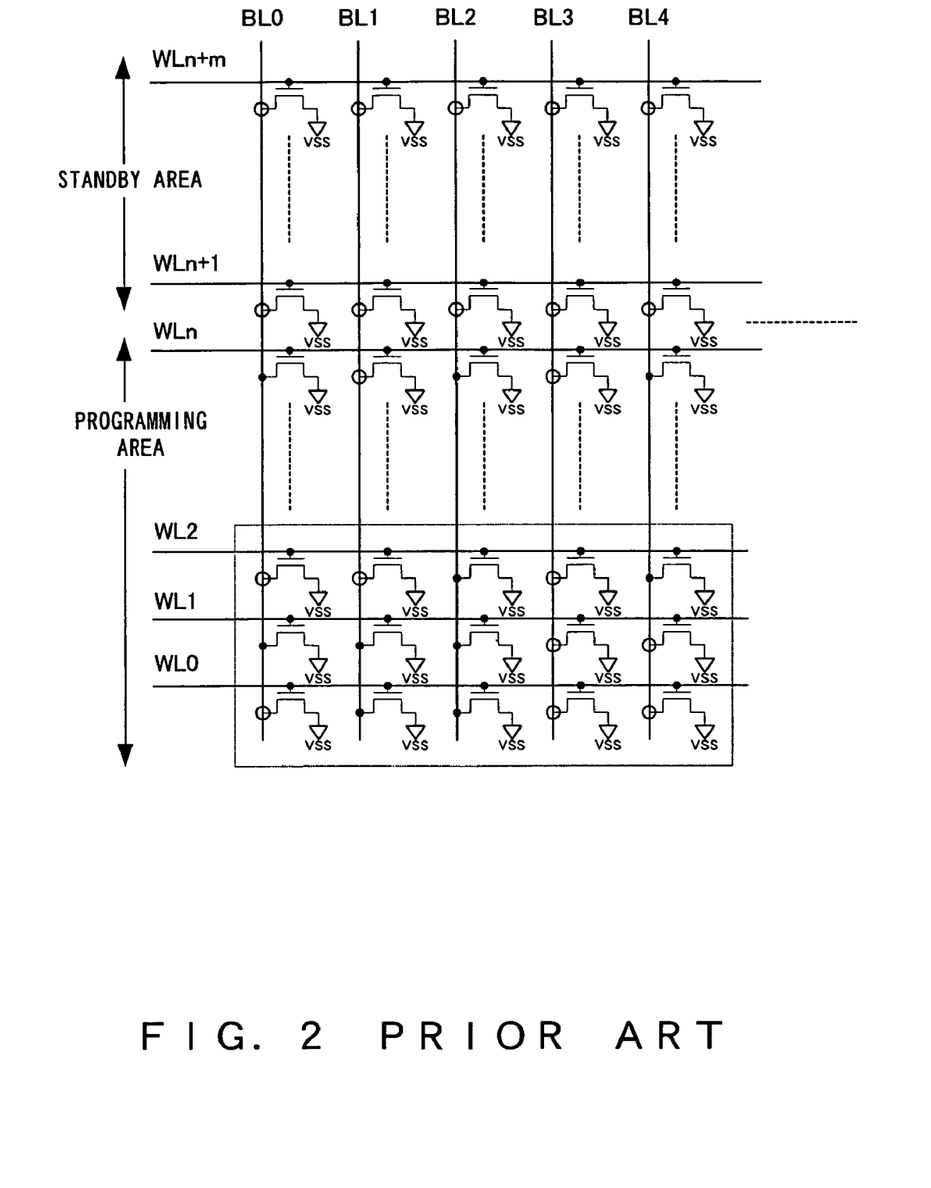
FIG. 2 explains the memory space of the ROM shown in FIG. 2.

FIG. 2 shows the memory space of read-only memory shown in FIG. 1. In FIG. 2, a programming area is constituted by word lines WL0 up to WLn, and a standby area is constituted by word lines WLn+1 up to WLn+m. Each word line is connected to the gate of a transistor corresponding to the memory cell, and one terminal of the transistor is connected to a power voltage $V_{ss}$.

In the programming area, some of the other terminal of the transistor is connected to the bit line and some is not connected to it. The connected ones are indicated by a black circle at the intersection with a bit line, and unconnected ones are indicated a white circle. In the standby area, no other terminal of the transistor is connected to a bit line. The existence/non-existence of connection with the bit line corresponds to, for example, "1" and "0" of data stored in the ROM, and by modifying this connection state, programming data can be modified. Since this modification corresponds to the existence/non-existence of a contact layer (beer) on each transistor, for example, by preparing a new reticle for a contact layer, the programming data can be updated.

However, in the conventional semiconductor integrated circuit shown in FIGS. 1 and 2, since a large space including the standby area is secured as a ROM memory space, the length of the bit line is unnecessarily extended, the pre-charge/discharge current of the bit line increases accordingly. This pre-charge/discharge current of the bit line occupies most of the ROM power consumption while power needed by such a longer bit line has no relation with the operation of the semiconductor integrated circuit. Therefore, the increase of the consumption power of the semiconductor integrated circuit due to such power is a problem.

As the prior art concerning an semiconductor storage device, such as ROM or the like, Patent reference 1 discloses a semiconductor storage device capable of reducing its chip area without increase in the number of manufacturing processes, by sharing a main memory cell array and a redundant memory cell array with one column decoder.

Patent reference 2 discloses a non-volatile semiconductor storage device capable of preventing the excess erase of an unused memory cell and a mis-operation due to bit line leak, by not applying erase bias to a replaced memory cell array.

Patent reference 1: Japanese Patent Application Publication No. H9-162308 "Semiconductor Storage Device"

Patent reference 2: Japanese Patent Application Publication No. 2002-150790 "Non-volatile Semiconductor Storage Device"

However, if a standby area other than a programming area is provided in read-only memory when such a prior art is used, the increase of ROM power consumption cannot be prevented.

SUMMARY OF THE INVENTION

It is an object of the present invention to reduce the power consumption of a semiconductor storage device, for example, by initially cutting off the bit line or word line of the semiconductor storage device, such as read-only memory and connecting it as requested.

The semiconductor storage device of the present invention comprises a plurality of memory cells, such as transistors, disposed in an array in their row and column directions and a bit line extending in the column direction of the memory cell or a word line extending in its row direction, which is disconnected in the middle of the array.

Alternatively, in read-only memory as a semiconductor storage device, the disconnected bit line can be connected by the same layer as used to modify the data storage contents of the read-only memory, such as a contact layer.

A bit line can also be disconnected on the boundary between the programming area and the standby area. Alternatively, each bit line can be disconnected in a different position, for example, in a position where no transistor connected to the bit line before exists.

According to the present invention, for example, the pre-charge/discharge current of the bit line can be reduced by cutting off the bit line or word line in the middle of the array of the memory cell and connecting it as requested, thereby reducing the power consumption of the semiconductor storage device.

DESCRIPTION OF THE PREFERRED EMBODIMENTS

Figure 3:
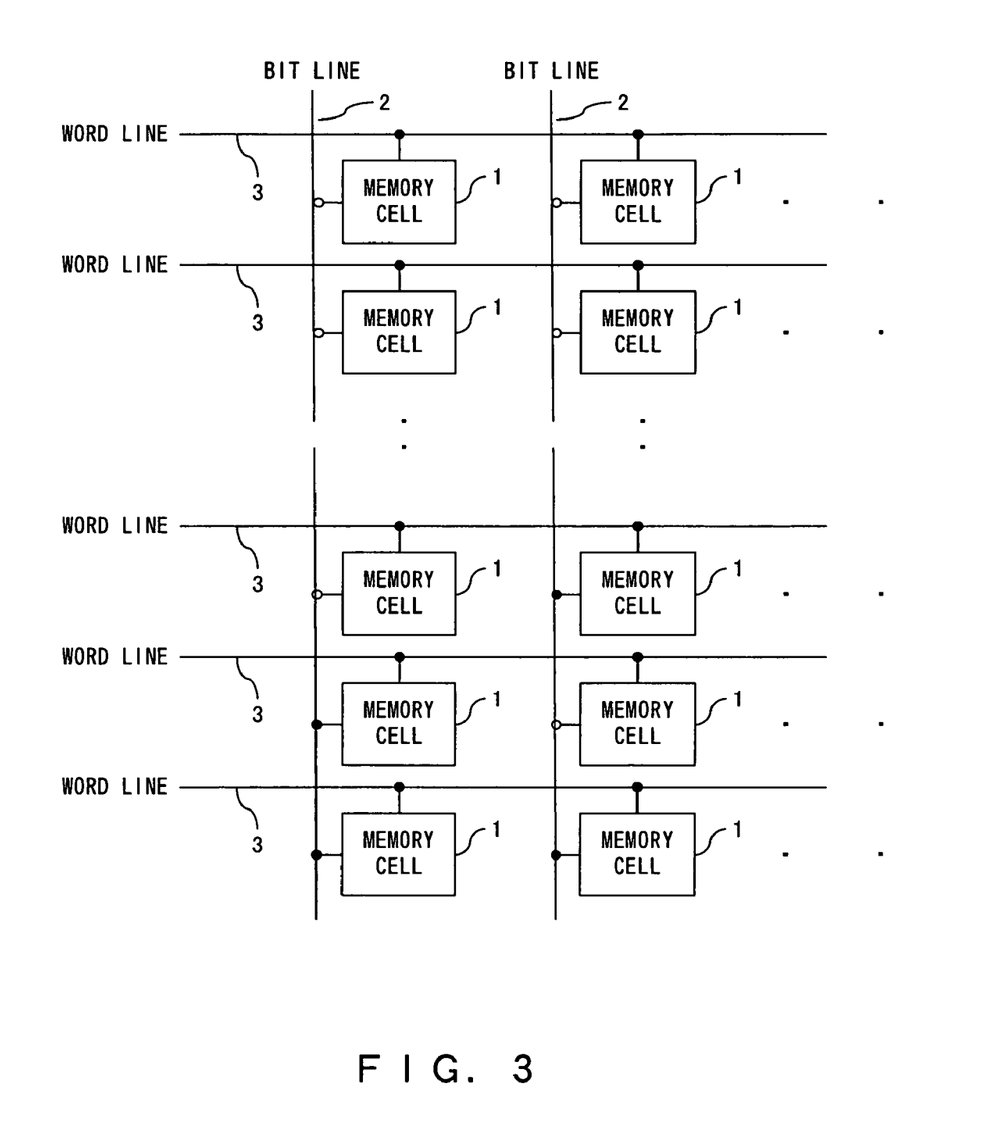
FIG. 3 explains the principle of the disconnection/connection method of the bit line or word line of the present invention.

FIG. 3 explains the principle of the semiconductor storage device, such as read-only memory, of the present invention. The semiconductor storage device of the present invention comprises a plurality of memory cells 1, such as transistors, disposed in an array in their row and column directions and a bit line 2 extending in the column direction of the memory cell or a word line 3 extending in its row direction, which is disconnected in the middle of the array. FIG. 3 shows the state where the bit line 2 is disconnected in the array of the array.

In the preferred embodiment of the present invention, in the read-only memory as a semiconductor storage device, a disconnected bit line is connected using the same layer as used to modify the data storage contents of the read-only memory, such as a contact layer.

In the preferred embodiment, a bit line can be disconnected, for example, on the boundary between a programming area and a standby shown in FIG. 2. Alternatively, each bit line can be disconnected in a different position, for example, in a position where no transistor connected to a bit line exists before.

Although the preferred embodiments of the present invention are described in detail with reference to the drawings, before describing them, the memory space layout of the semiconductor storage device of the preferred embodiment, such as read-only memory which is needed to describe them is described with reference to FIG. 4.

Figure 4:
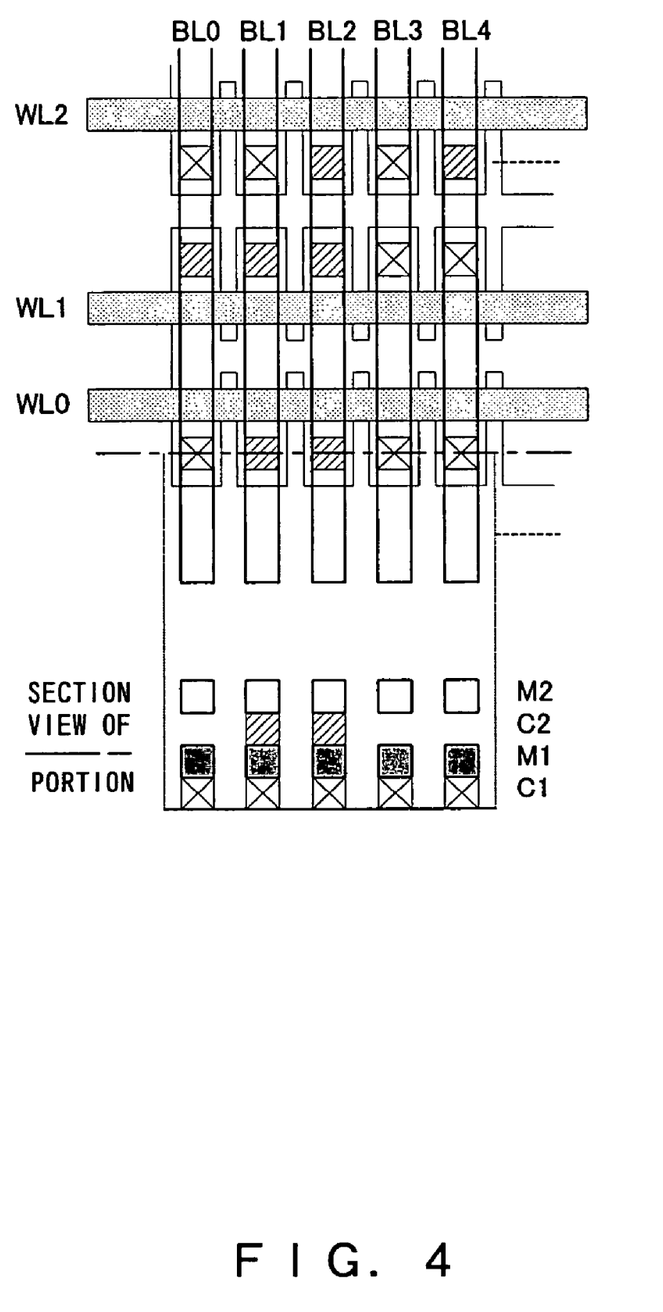
FIG. 4 explains the memory space layout of the preferred embodiment.

As shown in FIG. 4, for example, in the memory space of ROM, a contact layer C1 exists on a transistor corresponding to a memory cell, a metal layer M1 exists on the contact layer C1, a contact layer C2 exists on the metal layer M1 and a metal layer M2 exists on the top. The section of a part under a word line WL0 in FIG. 4, indicated by a one-dot chain line is shown below, where although the contact layer C1 and the metal layer M1 exist at the bottom and on the contact layer C1, respectively under the metal line M2 corresponding to each of bit lines BL0 through BL4, the contact layer C2 exists only under bit lines BL1 and BL2. In this case, although the bit lines BL1 and BL2 are connected to the transistor, bit lines BL0, BL3 and BL4 are not connected to the transistor.

Figure 5:
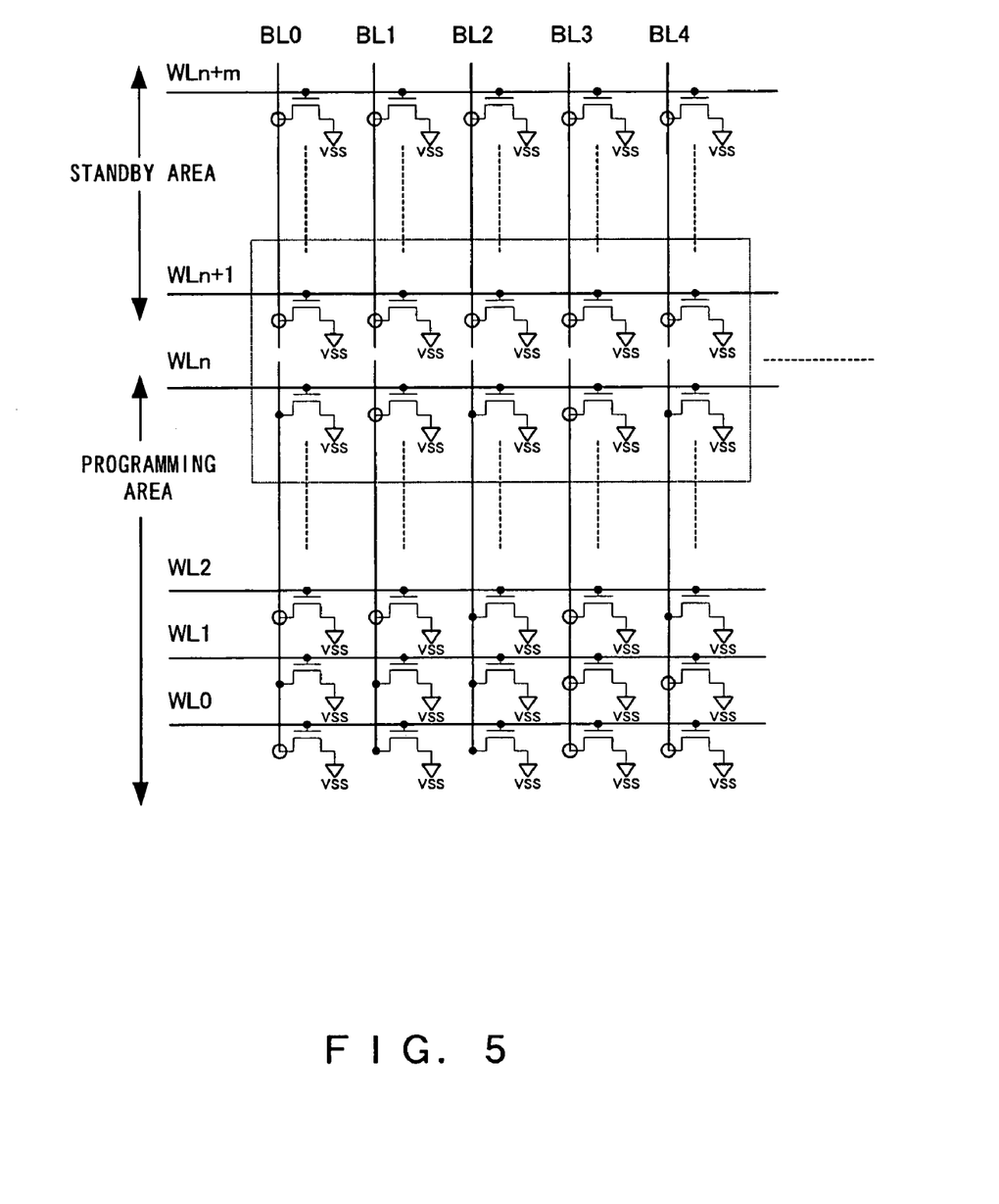
FIG. 5 explains the first preferred embodiment of a bit line disconnection/connection method.

FIG. 5 explains the first preferred embodiment of the bit line disconnection/connection method of the present invention. In this first preferred embodiment, bit lines BL0-BL4 is disconnected in the same position between a word line WLn belonging to the programming area and a word line WLn+1 belonging to the standby area. Thus, the load capacity of a bit line can be reduced, thereby reducing the pre-charge/discharge current of a bit line.

Figure 6:
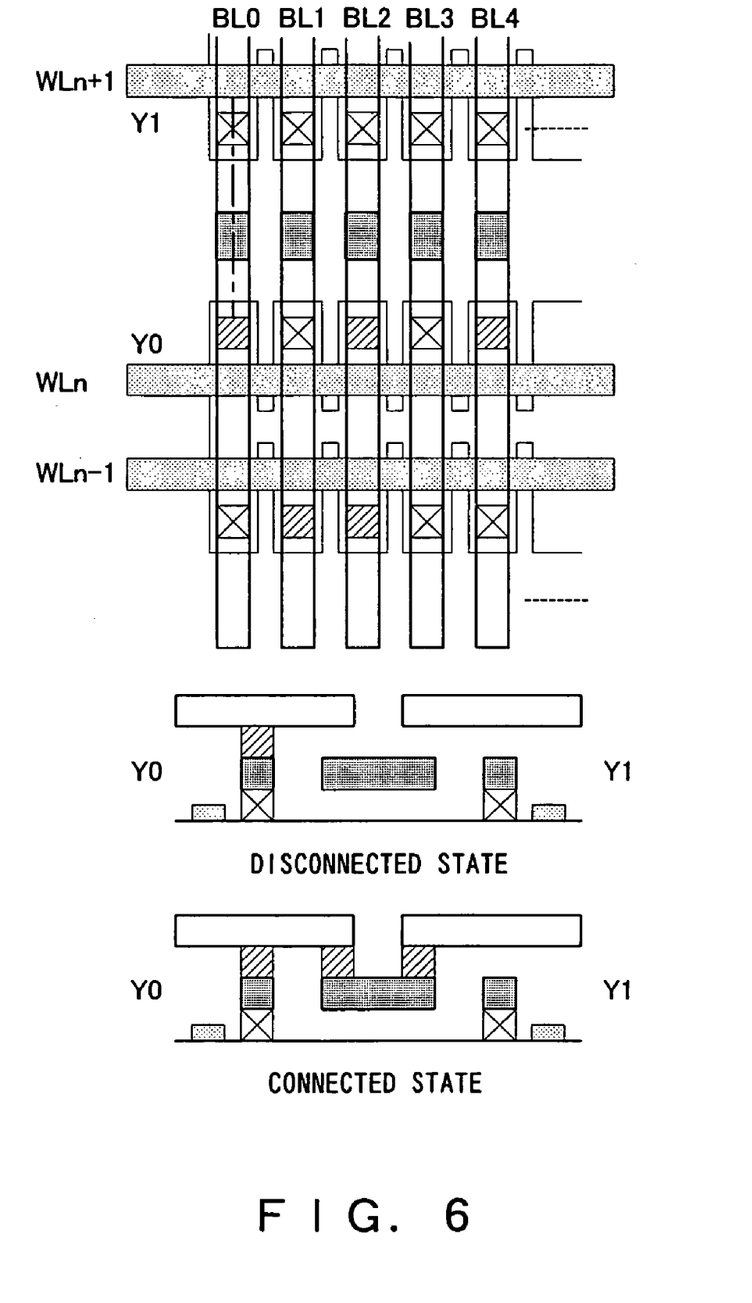
FIG. 6 explains a memory space layout of the first preferred embodiment.

FIG. 6 explains a memory space layout of the first preferred embodiment. In FIG. 6, in the first preferred embodiment, a bit line is connected/disconnected by the existence/non-existence of a contact layer C2 as in FIG. 4. In FIG. 6, a part between Y0 and Y1 corresponds to an area enclosed by a thin line including the word lines WLn and WLn+1 shown in FIG. 5. In this area, all the bit lines BL0-BL4 are disconnected. In this disconnected state, in a portion where no disconnected metal layer M2 exists, the metal layer M1 located secondly from the bottom of the layer disposition shown in FIG. 4 is seen.

For example, in the disconnected state of the section enclosed by a one-dot chain line, a disconnected bit line is connected by providing the contact layer C2 under the metal layer M2 in order to connect bit line BL0. As described with reference to FIG. 4, if the modification of the data (program) storage contents of read-only memory due to connection with a transistor can be made by the existence/non-existence of a contact layer C2, in FIG. 6, the contact layer C2 can be used both for data/program modification and bit line disconnection/connection.

Figure 7:
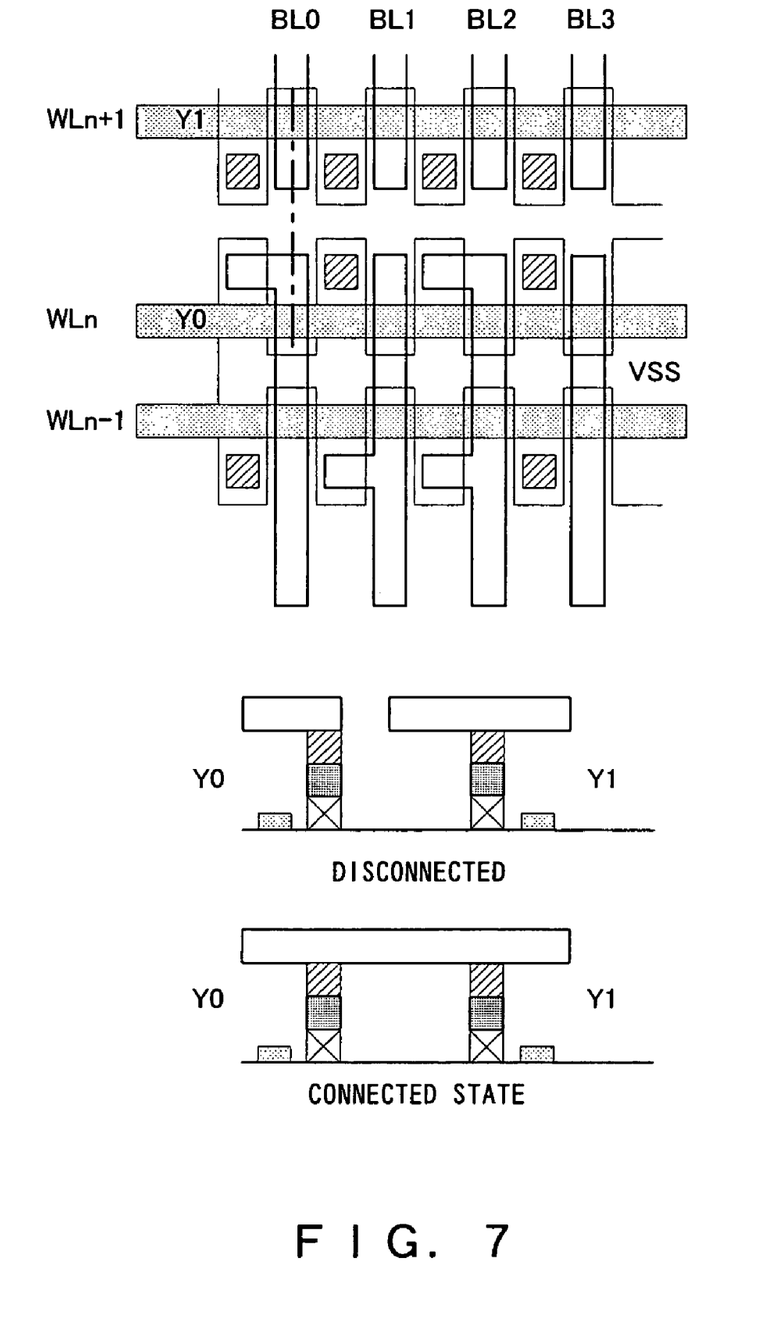
FIG. 7 explains another memory space layout of the first preferred embodiment.

FIG. 7 explains another memory space layout of the first preferred embodiment. In FIG. 7, a bit line is connected/disconnected by the existence/non-existence of a metal layer. For example, although a bit line BL0 indicated by an one-dot chain line is disconnected in a state where no metal layer M2 exists, by providing a metal layer M2, the bit line can be connected. For example, the contact layer C1, metal layer M1 and contact layer C2 in the disconnected state on the right side can be connected to a bit line by extending the bit line and be connected to a transistor under the bit line. Simultaneously, by the metal layer, an operation corresponding to the rewriting of the data/program storage contents of the ROM can be performed. Furthermore, for example, if the metal layer M2 on the contact layer C2 on the left side is removed and the bit line is connected by a tandem route, the transistor in the programming area shown in FIG. 5 can also disconnected, and the metal layer M2 can be used to modify data or a program and also to disconnect/connect a bit line.

So far, it has been described that four layers ranging from a contact layer C1 to a metal layer M2 exist in memory space as described in FIG. 4 and that the metal layer M2 is used as a layer for a bit line and the contact layer C2 or metal layer M2 is commonly used to modify data or a program and to connect/disconnect a bit line. However, a layer for modifying data or a program and a layer for connecting/disconnecting a bit line can also be separated. In this case, although a cost increases compared with the case of using the same layer, the degree of freedom of layout increases.

When FIGS. 6 and 7 are compared, in FIG. 6 an area needed to connect/disconnect a bit line becomes longer, while in FIG. 7 the necessary area becomes shorter since the bit line can be disconnected/connected by the existence/non-existence of the metal layer M2. Therefore, in FIG. 7, for example, data and a program can also be modified using a contact layer and a bit line can also be disconnected/connected by a metal layer.

Furthermore, although in the above description, four layers ranging from the contact layer C1 to the metal layer M2 are used for memory space layout, more layers, for example, contact layers C3, C4, . . . and so on in FIG. 6, and metal layers M3, M4, . . . and so on in FIG. 7, can also be used to disconnect/connect a bit layer.

Figure 8:
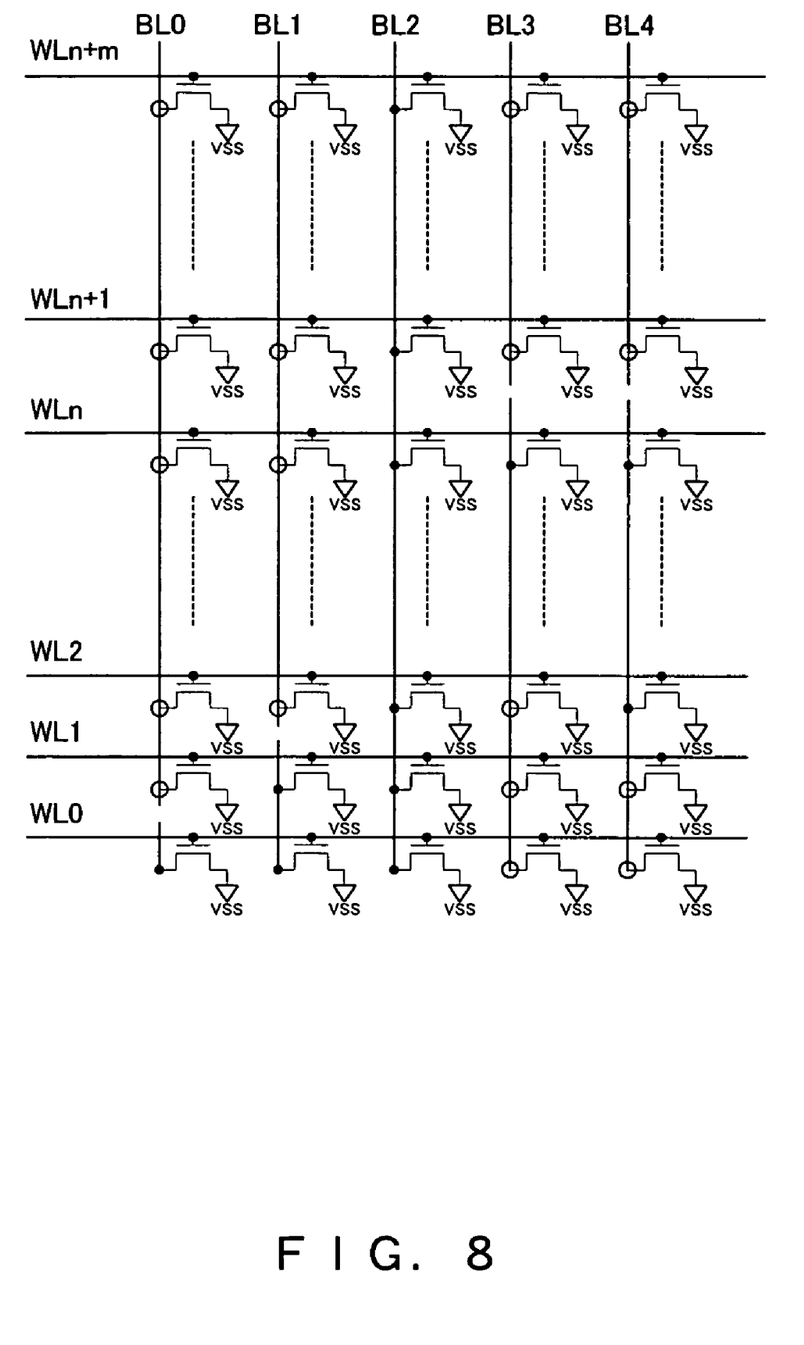
FIG. 8 explains the second preferred embodiment of a bit line disconnection/connection method.

FIG. 8 explains the second preferred embodiment of a bit line disconnection/connection method. In FIG. 8, a bit line BL0 is disconnected between word lines WL0 and WL1, BL1 is disconnected between word lines WL1 and WL2, BL3 and BL4 are disconnected between WLn and WLn+1 and a bit line BL2 is not disconnected. All transistors located upper than the disconnection point of each bit line are not connected to a bit line. In such a second preferred embodiment, by disconnecting each bit line in a different position where no transistor connected to a bit line exists before, a bit line can be disconnected in regardless of the boundary the programming area and standby area as described in FIG. 5, and when compared with the first preferred embodiment, the load capacity of a bit line can be further reduced, thereby reducing power consumption.

Figure 9:
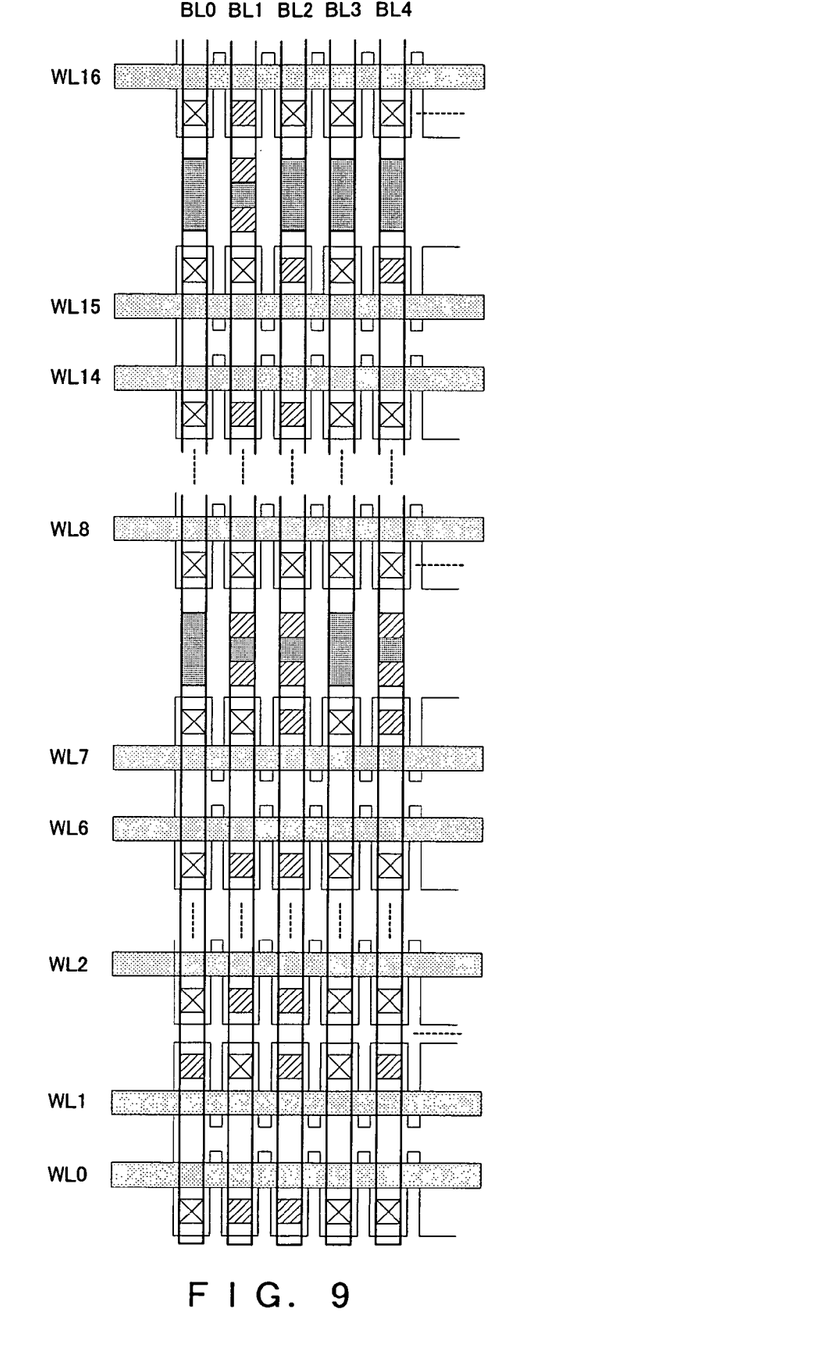
FIG. 9 explains the third preferred embodiment of a bit line disconnection/connection method.

FIG. 9 explains the third preferred embodiment of a bit line disconnection/connection method. In this third preferred embodiment, a bit line is disconnected/connected using a contact layer. However, as described in FIG. 6, if a contact layer is used, an area needed to disconnect/connect a bit line tends to become longer (wider). Therefore, if the disconnection/connection position of each bit line is different as in the second preferred embodiment, the entire layout efficiency of memory remarkably degrades.

Therefore, in the third preferred embodiment of FIG. 9, the degradation of the layout efficiency is mitigated by providing an area for disconnecting/connecting a bit line for every plurality of word lines, thereby reducing power consumption. In FIG. 9, an area for disconnecting/connecting a bit line is provided for every eight word lines, specifically, between word lines WL7 and WL8 and between WL15 and WL16.

In FIG. 9, each bit line existing in the metal layer 2 is shorter than in FIG. 6 in an area for disconnecting/connecting a bit line. In other words, although a blank part corresponding to each bit line also exists in a lower third and upper third of non-blank part in the disconnection/connection area, it indicates an area for disconnecting/connecting a bit line as a transparent part in order to clarify the disconnected/connected state of a bit line. Specifically, in bit lines BL1, BL2 and BL4, the contact layer C2 can be seen transparent in an area for disconnecting/connecting a bit line between word lines WL7 and WL8, in accordance with the connected state shown in FIG. 6, and in bit lines BL0 and BL3, the metal layer M1 can be seen transparent in accordance with the disconnected state shown in FIG. 6.

Figure 10:
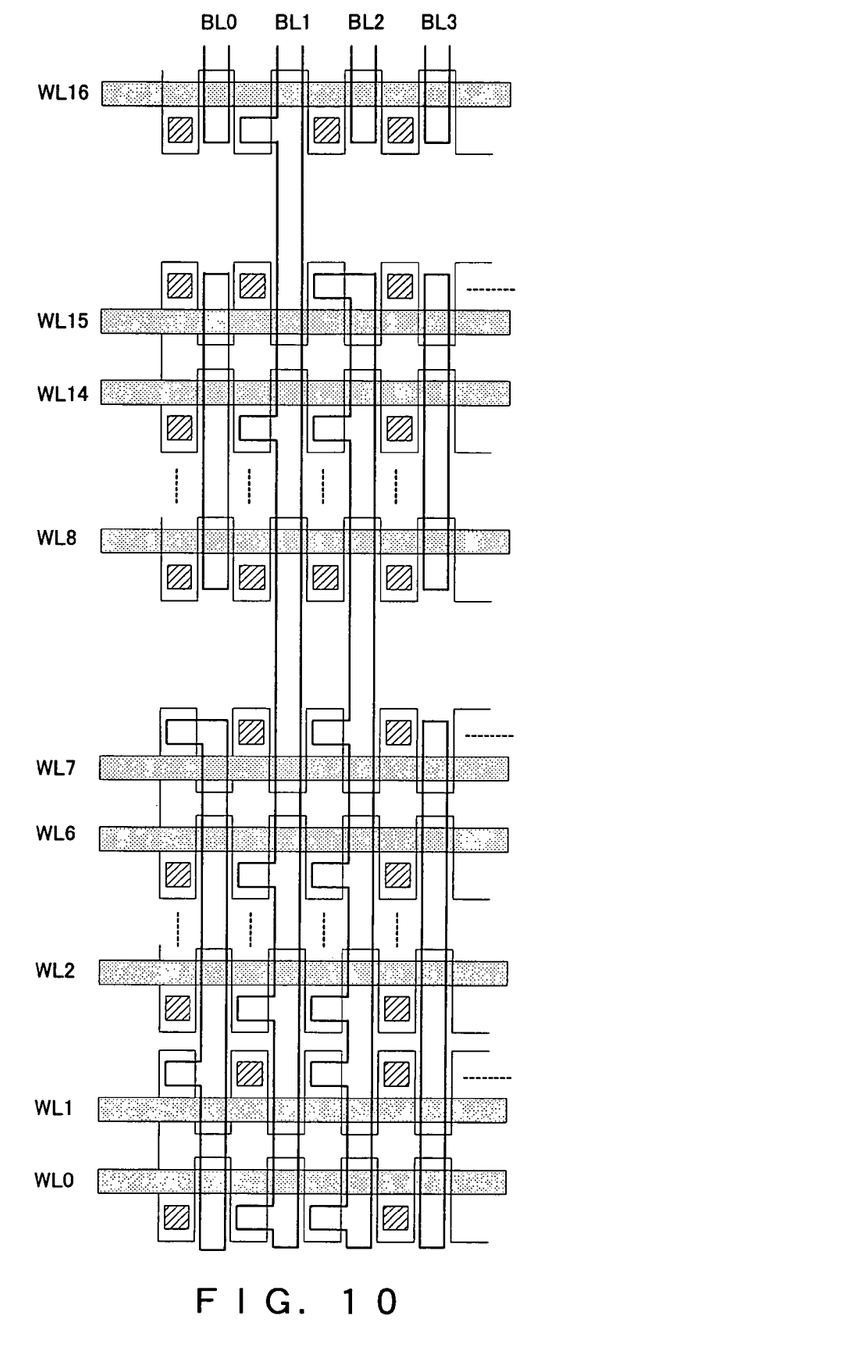
FIG. 10 explains the fourth preferred embodiment of a bit line disconnection/connection method.

FIG. 10 explains the fourth preferred embodiment of a bit line disconnection/connection method. In this fourth preferred embodiment, a bit line is disconnect/connected using a metal layer. However, in this case, an area for disconnecting/connecting a bit line cannot be shorter (narrower) by a layout method, as in FIG. 7, and sometimes the area must be made large. For example, if the disconnection/connection position is different for each bit line, as in the second preferred embodiment of FIG. 8, the layout efficiency of memory remarkably degrades as described in FIG. 9. Therefore, even when a metal layer is used to disconnect/connect a bit line, as shown in FIG. 10, for example, by providing a bit line disconnection/connection area for every eight word lines, the degradation of the layout efficiency must be avoided, thereby reducing power consumption.

Next, the disconnection/connection of a word line of this preferred embodiment is described. In the current manufacturing technology of an semiconductor integrated circuit, more particularly read-only memory, it is fairly technically easy to disconnect/connect a bit line, but the disconnection/connection of a word line has some technical problem. However, by disconnecting a word line as in a bit line, the power consumption of ROM can be reduced.

Figure 11:
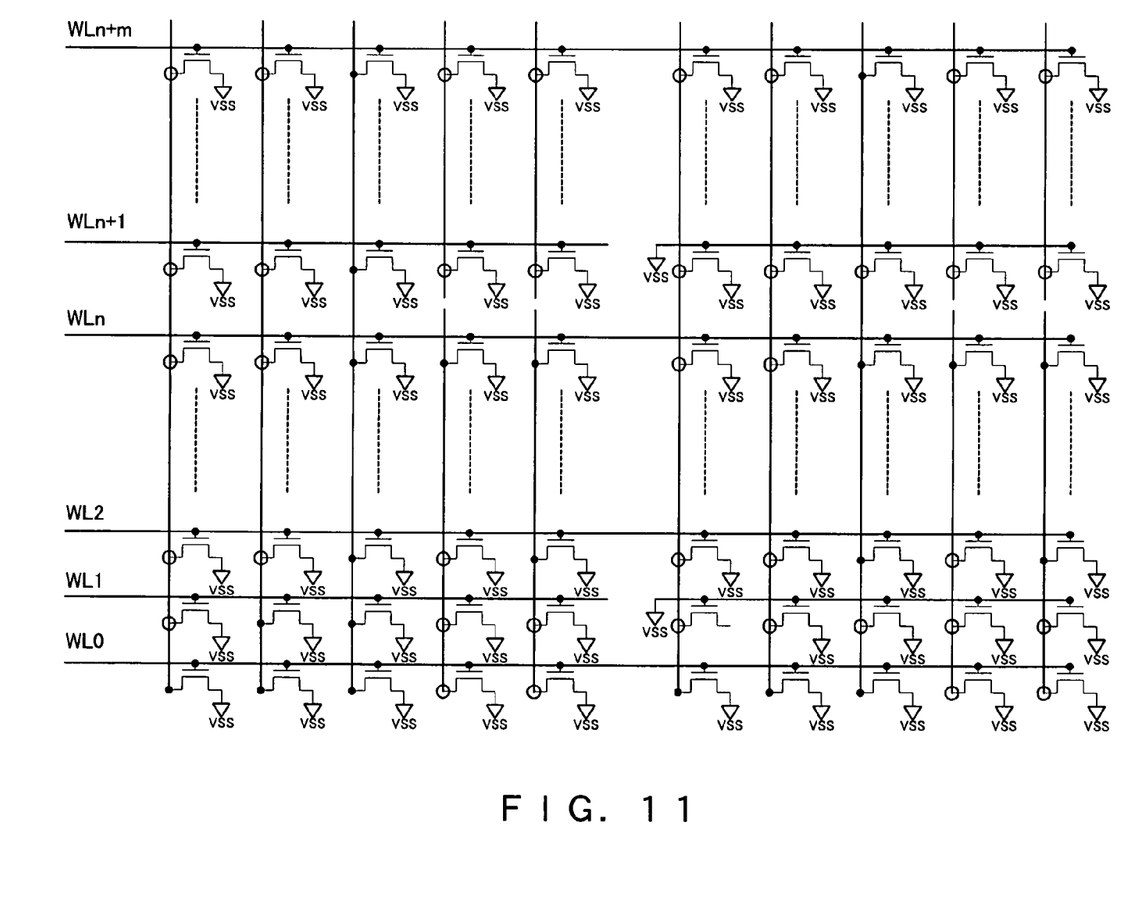
FIG. 11 explains the first preferred embodiment of a word line disconnection/connection method.
Figure 12:
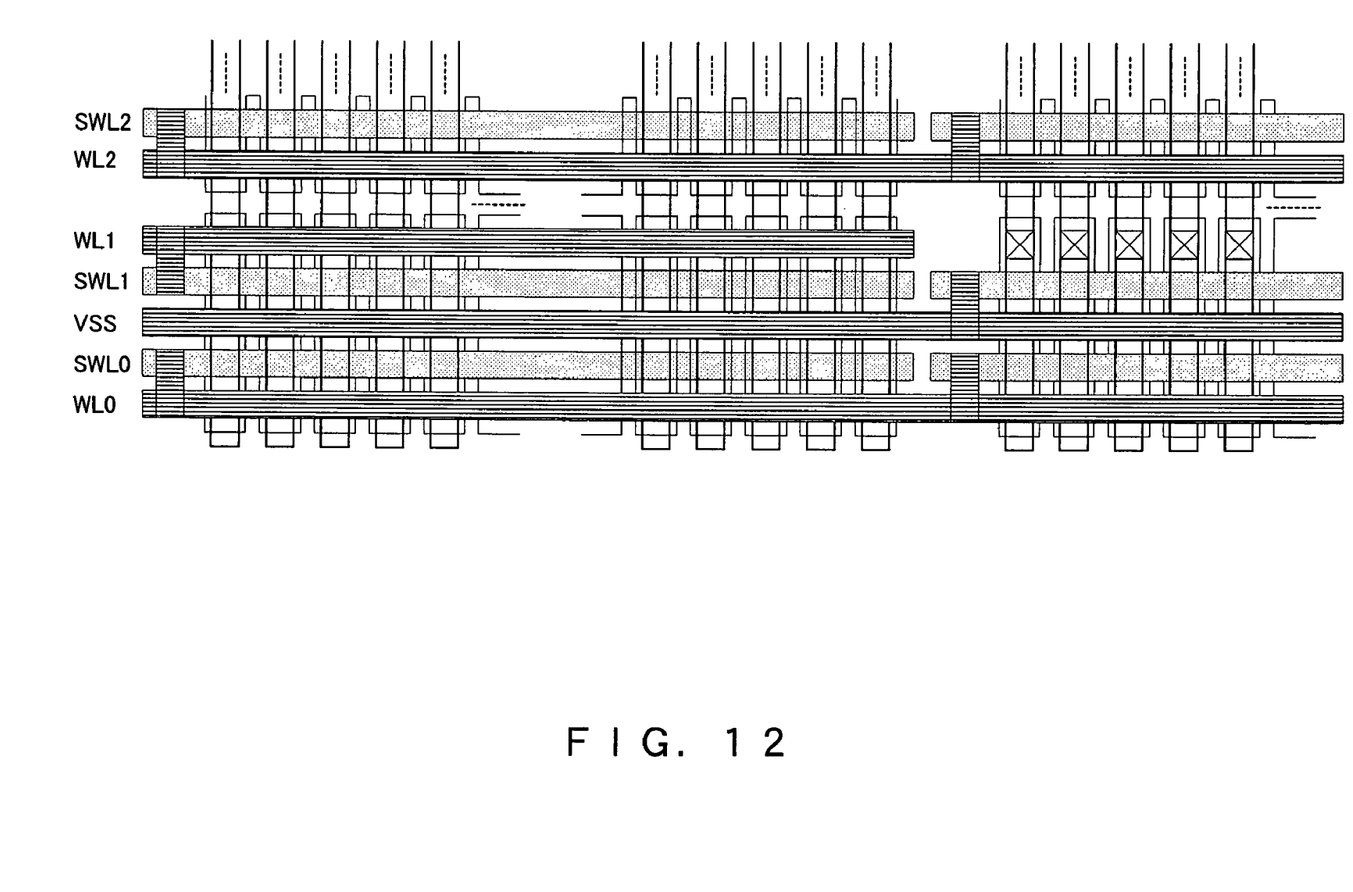
FIG. 12 explains the plane image of the layout shown in FIG. 11.

FIGS. 11 and 12 explain the first preferred embodiment of a word line disconnection/connection method. FIG. 11 shows a method for basically disconnecting each word line in a different position. Specifically, if only a transistor which is not connected to a bit line exists on the right side, each word line can be disconnected in the position. In FIG. 11, word lines WL1 and WLn+1 are disconnected in the same position, and the gate of each transistor on the right side is clipped to power voltage $V_{ss}$. However, this clip of the gate to $V_{ss}$ is not always needed and can be floated. In FIG. 11, the disconnection position of word lines WL1 and WLn+1 can also be made closer to the left side.

Figure 13:
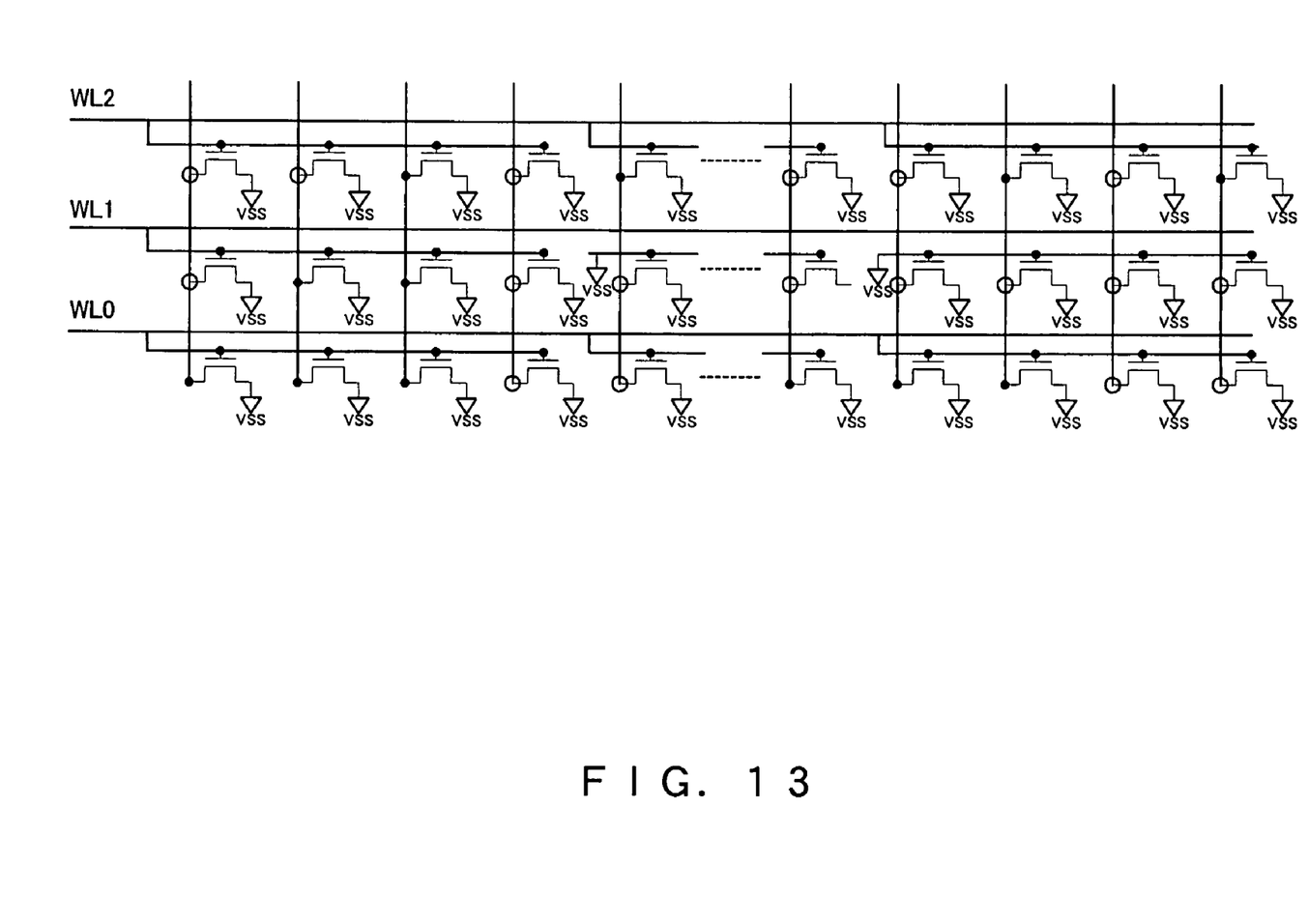
FIG. 13 explains the second preferred embodiment of a word line disconnection/connection method.
Figure 14:
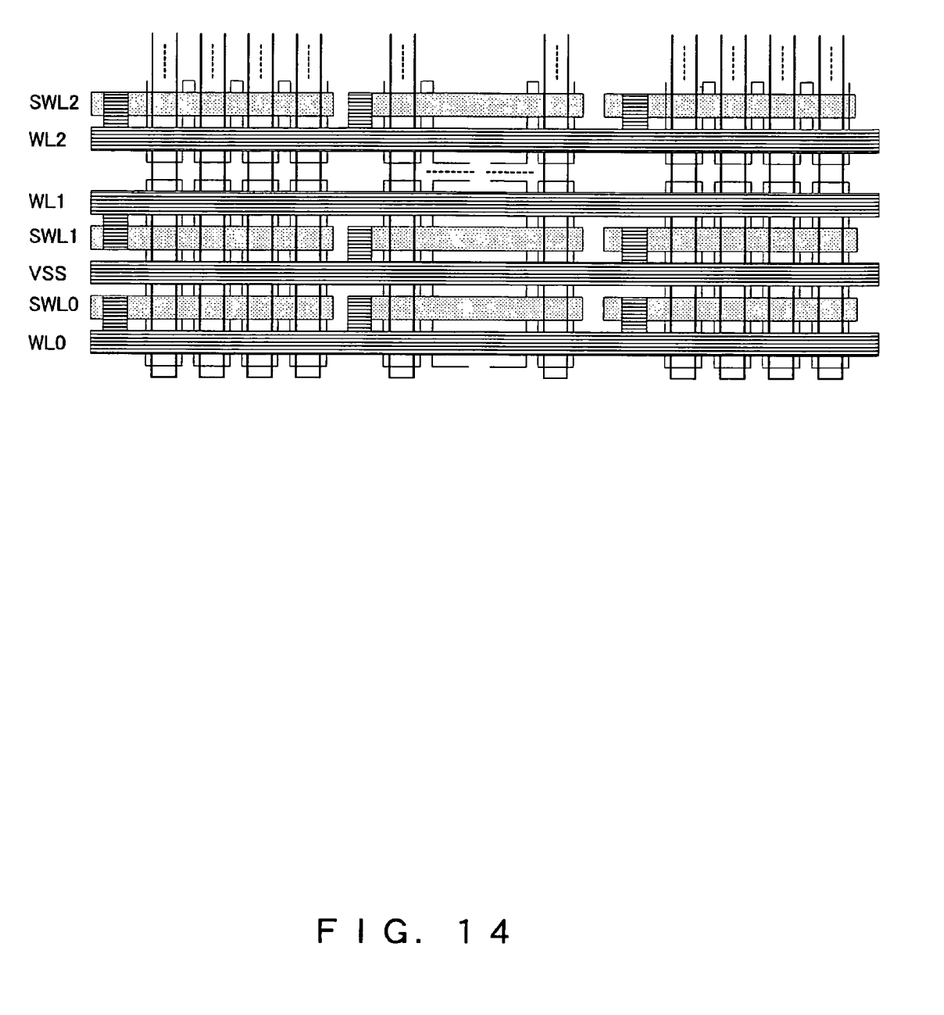
FIG. 14 explains the plane image of the layout shown in FIG. 13.

FIG. 12 shows the plane layout image of memory corresponding to FIG. 11. FIG. 12 shows an image in the case where sub-word lines SWL0-SWL2, which will be described with reference to FIGS. 13 and 14, are used. This sub-word line is shared by the gate poly-silicon of a plurality of transistors, and by connecting the word line and a sub-word line of a metal layer, a word line and a sub-word line can be connected for every plurality of transistors (memory cells). In FIG. 12, a word line WL1 is disconnected on the right side, and a sub-word line SWL1 corresponding to this word line is connected to the power voltage $V_{ss}$.

FIGS. 13 and 14 explain the second preferred embodiment of a word line disconnection/connection method. As described earlier, in this preferred embodiment, in addition to an essential word line, a sub-word line shared by the gate poly-silicon of a plurality of transistors is used. In FIG. 13, for example, a word line WL0 is connected to a sub-word line shared by the gate poly-silicon of every four transistors on the right and left sides and a sub-word line shared by the gate poly-silicon of a plurality of transistors around the center. In this case, for example, by separating a word line WL1 from two sub-word lines on the right side and clipping the two sub-word lines on the right side to power voltage $V_{ss}$, the load capacity of the word line WL1 can be mitigated.

FIG. 14 shows the plane layout image of memory corresponding to FIG. 13. In FIG. 14, although the word line WL1 also extends on the right side unlike in FIG. 12, for example, a sub-word line SWL1 is not connected to the word line WL1 in the same position as in FIG. 12 and is connected to the power voltage $V_{ss}$. In a part on the left side, not indicated by a bit liner, word lines WL0 and WL2 and sub-word lines SWL0 and SWL2 are connected.

The connection/disconnection between a word line WL and a sub-word line can be switched in units of a part of a sub-word line. If the driver of the word line WL is located, for example, on the left side, WLs and SWLs can be set to be connected, disconnected, connected, . . . and so on from the left side.

What is claimed is:
1. A semiconductor storage device, comprising:
 a plurality of memory cells disposed in an array in the row and column directions;

a bit line extending in the column direction of the memory cell or a word line extending in its row direction, which is disconnected in the middle of the array; and a plurality of sub-word lines which is connected for every plurality of columns of the memory cell in an array and should be connected to the word line, wherein some of the plurality of sub-word lines is not connected to the word line.

2. The semiconductor storage device according to claim 1, which is read-only memory, wherein the disconnected bit line is connected using the same layer as used to modify data storage contents of the read-only memory.

3. The semiconductor storage device according to claim 2, wherein the same layer is a metal layer.

4. The semiconductor storage device according to claim 2, wherein the same layer is a contact layer.

5. The semiconductor storage device according to claim 1, which is read-only memory, wherein the bit line is disconnected on a boundary between a data storage area of the read-only memory and its standby data storage area.

6. The semiconductor storage device according to claim 5, wherein the disconnected bit line is connected using the same layer as used to modify data storage contents of the read-only memory.

7. The semiconductor storage device according to claim 6, wherein the same layer is a metal layer.

8. The semiconductor storage device according to claim 6, wherein the same layer is a contact layer.

9. The semiconductor storage device according to claim 1, wherein the bit lines are disconnected in a different position for each column of the memory cell in an array.

10. The semiconductor storage device according to claim 9, which is read-only memory, wherein the disconnected bit line is connected using the same layer as used to modify data storage contents of the read-only memory.

11. The semiconductor storage device according to claim 10, wherein the same layer is a metal layer.

12. The semiconductor storage device according to claim 10, wherein the same layer is a contact layer.

13. The semiconductor storage device according to claim 1, wherein the bit lines are disconnected for every plurality of rows of the memory cell in an array.

14. The semiconductor storage device according to claim 13, which is read-only memory, wherein the disconnected bit line is connected using the same layer as used to modify data storage contents of the read-only memory.

15. The semiconductor storage device according to claim 14, wherein the same layer is a metal layer.

16. The semiconductor storage device according to claim 14, wherein the same layer is a contact layer.

17. The semiconductor storage device according to claim 1, which is read-only memory, wherein the disconnected bit line is connected using a metal layer, and the data storage contents of the read-only memory is modified using a contact layer.

18. The semiconductor storage device according to claim 1, wherein the word lines are disconnected in a different position for each row of the memory cell in an array.

* * * * *